United States Patent
Bertram et al.

(10) Patent No.: US 11,611,022 B2
(45) Date of Patent: Mar. 21, 2023

(54) PHOSPHOR MIXTURE, CONVERSION ELEMENT AND OPTOELECTRONIC COMPONENT

(71) Applicant: Osram OLED GmbH, Regensburg (DE)

(72) Inventors: Ralph Peter Bertram, Herzogenrath (DE); David O'Brien, Portland, OR (US); Rainer Butendeich, Sinzing (DE)

(73) Assignee: Osram OLED GmbH, Regensburg (DE)

( * ) Notice: Subject to any disclaimer, the term of this patent is extended or adjusted under 35 U.S.C. 154(b) by 243 days.

(21) Appl. No.: 16/753,344

(22) PCT Filed: Sep. 25, 2018

(86) PCT No.: PCT/EP2018/076005
§ 371 (c)(1),
(2) Date: Apr. 3, 2020

(87) PCT Pub. No.: WO2019/068521
PCT Pub. Date: Apr. 11, 2019

(65) Prior Publication Data
US 2020/0287102 A1    Sep. 10, 2020

(30) Foreign Application Priority Data
Oct. 4, 2017 (DE) .................. 10 2017 122 996.5

(51) Int. Cl.
*H01L 33/50* (2010.01)
*B82Y 20/00* (2011.01)

(52) U.S. Cl.
CPC ............ *H01L 33/504* (2013.01); *B82Y 20/00* (2013.01)

(58) Field of Classification Search
CPC .................................................. H01L 33/504
See application file for complete search history.

(56) References Cited

U.S. PATENT DOCUMENTS

| 6,525,460 | B1 | 2/2003 | Soules et al. |
| 8,529,791 | B2 | 9/2013 | Wu et al. |
| 8,597,545 | B1 | 12/2013 | Liu et al. |

(Continued)

FOREIGN PATENT DOCUMENTS

| CN | 101124682 A | 2/2008 |
| CN | 105810786 A | 7/2016 |

(Continued)

OTHER PUBLICATIONS

Japanese Notification of Reasons for Refusal issued for the Japanese patent application No. 2020-518418, dated May 10, 2021, 13 pages (including 8 pages English Translation).

(Continued)

*Primary Examiner* — Sarah K Salerno
(74) *Attorney, Agent, or Firm* — Viering, Jentschura & Partner MBB

(57) ABSTRACT

An optoelectronic component may include a radiation-emitting semiconductor chip configured to emit electromagnetic radiation and a phosphor mixture. The excitation spectrum may have a peak wavelength ranging from 435 nm to 460 nm. The phosphor mixture may have three phosphors configured to emit electromagnetic radiation in different spectral ranges.

18 Claims, 4 Drawing Sheets

(56) References Cited

U.S. PATENT DOCUMENTS

| | | |
|---|---|---|
| 2005/0236959 A1 | 10/2005 | Toth et al. |
| 2012/0146079 A1 | 6/2012 | Baumann et al. |
| 2013/0264937 A1 | 10/2013 | Sakuta et al. |
| 2015/0171284 A1* | 6/2015 | Bechtel ................ H01L 33/507 257/98 |
| 2017/0045201 A1* | 2/2017 | Jones ...................... F21V 5/10 |
| 2017/0047488 A1 | 2/2017 | Kaneko et al. |
| 2017/0077360 A1 | 3/2017 | Yang et al. |
| 2017/0309795 A1 | 10/2017 | Kim et al. |
| 2017/0329068 A1* | 11/2017 | Cho ...................... H01L 33/502 |
| 2018/0198031 A1* | 7/2018 | Kim ...................... H01L 33/486 |
| 2019/0136129 A1* | 5/2019 | Moon ................ C09K 11/7734 |
| 2019/0148605 A1* | 5/2019 | Mu ........................ H01L 33/50 257/98 |

FOREIGN PATENT DOCUMENTS

| | | |
|---|---|---|
| DE | 60118476 T2 | 11/2006 |
| DE | 102009037730 A1 | 2/2011 |
| DE | 102015105893 A1 | 10/2016 |
| DE | 102015105896 A1 | 10/2016 |
| EP | 2549330 A1 | 1/2013 |
| JP | 2012104814 A | 5/2012 |
| JP | 2015008335 A | 1/2015 |
| JP | 2015530740 A | 10/2015 |
| JP | 2017041629 A | 2/2017 |
| KR | 1020130057354 A | 5/2013 |
| WO | 2015057930 A1 | 4/2015 |
| WO | 2015166782 A1 | 11/2015 |
| WO | 2016056837 A1 | 4/2016 |

OTHER PUBLICATIONS

German Search Report issued for the corresponding DE-Application No. 10 2017 122 996.5, dated May 17, 2018, 9 pages (for informational purpose only).

International Search Report issued for the corresponding PCT-Application No. PCT/EP2018/076005, dated Jan. 30, 2019, 14 pages (for informational purpose only).

Lee et al., "Smart design to resolve spectral overlapping of phosphor-in-glass for high-powered remote-type white light-emitting devices", Optics Letters, dated Feb. 15, 2014, pp. 762-765, vol. 39, No. 4.

Japanese search report issued for the corresponding JP patent application No. 2020-518418, dated Apr. 2, 2021, 18 pages (for informational purposes only).

First Search document issued for the corresponding CN Application No. 2018800652529, dated May 20, 2022, 2 pages (for informational purposes only).

* cited by examiner

PHOSPHOR MIXTURE, CONVERSION ELEMENT AND OPTOELECTRONIC COMPONENT

CROSS-REFERENCE TO RELATED APPLICATIONS

The present application is a national stage entry according to 35 U.S.C. § 371 of PCT application No.: PCT/EP2018/076005 filed on Sep. 25, 2018; which claims priority to German Patent Application Serial No.: 10 2017 122 996.5, which was filed on Oct. 4, 2017; which are incorporated herein by reference in their entirety and for all purposes.

TECHNICAL FIELD

A phosphor mixture, a conversion element and an optoelectronic component are specified.

BACKGROUND

Various phosphor mixtures are described for example in the document Ken T. Shimizu et al., Photonic Research vol. 5, No. 2, April 2017.

The intention is to specify an improved phosphor mixture which is suitable, in particular, for producing a high efficiency with good color rendering in the case of use in an optoelectronic component. Furthermore, the intention is to specify a conversion element which is likewise suitable, in particular, for producing a high efficiency with good color rendering in the case of use in an optoelectronic component.

Moreover, the intention is to specify an optoelectronic component having increased efficiency and improved color rendering.

SUMMARY

In accordance with one embodiment, the phosphor mixture includes a first phosphor, which has an emission spectrum having a full width half maximum, called "FWHM width" (short for "Full Width Half Maximum width") hereinafter, of between 70 nanometers and 150 nanometers inclusive. The first phosphor emits electromagnetic radiation from the green spectral range.

The emission spectrum is generally a diagram in which the spectral intensity or the spectral luminous flux per wavelength interval ("spectral intensity/spectral luminous flux") of the light emitted by the phosphor or some other element is represented as a function of the wavelength λ. In other words, the emission spectrum constitutes a curve in which the wavelength is plotted on the x-axis and the spectral intensity or the spectral luminous flux is plotted on the y-axis. The emission spectrum of an LED or of an individual phosphor generally has a maximum at a peak wavelength. The term FWHM width relates to a curve having a maximum, such as the emission spectrum, for instance, wherein the FWHM width is that range on the x-axis which corresponds to the two y-values which correspond to half the maximum.

In accordance with a further embodiment, the phosphor mixture includes a second phosphor, which has an emission spectrum having an FWHM width of between 1 nanometer and 40 nanometers inclusive. The second phosphor has an FWHM width of between 24 nanometers and 40 nanometers inclusive. The second phosphor emits electromagnetic radiation from the red spectral range.

In accordance with a further embodiment, the phosphor mixture includes a third phosphor, which has an emission spectrum having an FWHM width of between 25 nanometers and 100 nanometers inclusive. The third phosphor particularly emits electromagnetic radiation from the orange-red spectral range.

In accordance with one embodiment, upon excitation with electromagnetic radiation of an excitation spectrum, the phosphor mixture emits electromagnetic radiation of a total conversion spectrum composed of the emission spectra of the phosphors in the phosphor mixture.

In accordance with one embodiment, the phosphor mixture includes a first, green phosphor having an emission spectrum having an FWHM width of between 70 nanometers and 150 nanometers inclusive, and also a second, red phosphor having an emission spectrum having an FWHM width of between 1 nanometer and 40 nanometers inclusive, and a third, orange-red phosphor having an emission spectrum having an FWHM width of between 25 nanometers and 100 nanometers inclusive.

In a non-limiting embodiment, in this case the FWHM width of the second, red phosphor is comparatively small relative to the FWHM width of the first, green phosphor and of the third, orange-red phosphor. In this case, the third, orange-red phosphor, which emits electromagnetic radiation from the orange-red spectral range, advantageously broadens the narrow emission spectrum of the second, red phosphor and thus advantageously fills up the total conversion spectrum of the phosphor mixture, without generating too much electromagnetic radiation in the long-wave range with wavelengths of greater than 635 nanometers, this range being evaluated poorly by the eyes. This increases the color rendering of the phosphor mixture with at the same time high efficiency.

In accordance with one embodiment of the phosphor mixture, the first, green phosphor is an activator-based phosphor and the second, red phosphor is a quantum dot phosphor.

The red-emitting quantum dot phosphor has the advantage of generating only little light in the non-visible, infrared spectral range. Furthermore, the narrowband quantum dot phosphor having emission wavelengths in the long-wave red range improves the efficiency of the phosphor mixture.

The activator-based phosphor includes a crystalline, for example ceramic, host lattice, into which impurity ions are introduced as activators. The activator imparts the wavelength-converting properties to the activator-based phosphor. The host lattice alters the electronic structure of the activator in such a way that electromagnetic radiation having the excitation wavelength is absorbed in the material and excites an electronic transition in the activator-based phosphor, which undergoes transition to the ground state again with emission of electromagnetic radiation having the emission spectrum.

By way of example, activator-based phosphors can be present in particle form with grain sizes of between 1 micrometer and 30 micrometers.

In contrast thereto, quantum dot phosphors are very small semiconducting particles having a size in the nanometers range, the converting properties of said particles arising on account of their limited dimension.

Quantum dot phosphors may include a core and a shell ("core-shell quantum dot"), wherein both the core and the shell include a semiconductor material or are formed from a semiconductor material. The band gap of the shell is generally set by way of the material and the size such that the shell absorbs the electromagnetic radiation of the excitation wavelength. The core of the quantum dot phosphor is generally set by way of the material and the size such that it emits at least part of the energy absorbed with the electromagnetic radiation of the excitation wavelength once again as electromagnetic radiation of the emission spectrum.

Core or core and shell of a particle of the quantum dot phosphor has or have for example a diameter of between 2 nanometers and 20 nanometers inclusive.

In addition, the quantum dot phosphor can also have one or more claddings. The cladding is provided for protecting the materials of core and/or cladding against the influence of external substances, such as oxygen or water, which can lead to oxidation of the materials of these elements. In addition, the cladding can be suitable for at least reducing agglomeration of the quantum dot phosphors. The cladding can contain a resin or a glass or consist of a resin or a glass. A grain of a quantum dot phosphor including a cladding can have for example a diameter of between 50 nanometers and 20 micrometers inclusive. In this case, it is also possible for the cladding of a grain to include a plurality of particles of a quantum dot phosphor.

Quantum dot phosphors generally have an emission spectrum having a significantly smaller FWHM width than activator-based phosphors. Particularly as a result of the narrowband emission in the red to orange spectral range, quantum dot phosphors make possible comparatively high efficiencies in the case of use in optoelectronic components which emit white or warm-white light. In this case, quantum dot phosphors advantageously make possible an efficiency that is more than 10% to 20% above the efficiency of activator-based phosphors.

One concept on which the present phosphor mixture is based is to fill out the narrow emission spectrum of the second, red phosphor, which is embodied as a quantum dot phosphor, by the third, orange-red-emitting phosphor having an emission spectrum having a greater FWHM width and thus to obtain a more continuous total conversion spectrum. This improves the color rendering of the phosphor mixture vis-à-vis a phosphor mixture without the third, orange-red phosphor.

In a non-limiting embodiment, the ratio of third, orange-red phosphor to second, red quantum dot phosphor is adapted such that the efficiency of the phosphor mixture is optimized.

By way of example, the second, red quantum dot phosphor includes one of the following materials or is formed from one of the following materials: CdSe, CdS, CdTe, InP, InAs, Cl(Z)S, AlS, $Zn_3N_2$, Si, ZnSe, ZnO, GaN.

The red quantum dot phosphor generally includes cadmium. Since cadmium is harmful to the environment, the legally prescribed proportion of cadmium in optoelectronic components is limited by EU Directive 2011/65/EU (RoHS directive, short for "Restriction of Hazardous Substances").

The partial replacement of the red quantum dot phosphor by a third, orange-red activator-based phosphor advantageously reduces the proportion of cadmium in the phosphor mixture and simplifies compliance with the RoHS directive.

In accordance with a further embodiment of the phosphor mixture, the third phosphor has an FWHM width of between 40 nanometers and 100 nanometers inclusive. In a non-limiting embodiment, the third phosphor has an FWHM width of between 70 nanometers and 90 nanometers inclusive. In this embodiment, the third, orange-red phosphor is an activator-based phosphor.

In accordance with a further embodiment of the phosphor mixture, the FWHM width of the emission spectrum of the third, orange-red phosphor is between 25 nanometers and 45 nanometers inclusive. In a non-limiting embodiment, the FWHM width of the third, orange-red phosphor is less than 30 nanometers. In this embodiment, the third, orange-red phosphor is a quantum dot phosphor.

In accordance with a further embodiment of the phosphor mixture, the FWHM width of the emission spectrum of the third, orange-red phosphor can be between 70 nanometers and 90 nanometers inclusive. In this embodiment, the third, orange-red phosphor is an activator-based phosphor. In this embodiment, the second, red phosphor is a quantum dot phosphor having an emission spectrum having a comparatively small FWHM width.

In accordance with an embodiment of the phosphor mixture, the second, red phosphor has a peak wavelength of between 610 nanometers and 635 nanometers inclusive.

In accordance with a further embodiment of the phosphor mixture, the third, orange-red phosphor has a peak wavelength of between 580 nanometers and 620 nanometers inclusive, such as between 600 nanometers and 610 nanometers inclusive.

In accordance with a further embodiment of the phosphor mixture, the emission spectrum of the third, orange-red phosphor has a peak wavelength which has a spectral separation with respect to the peak wavelength of the emission spectrum of the second, red phosphor of between 5 nanometers and 30 nanometers inclusive. In this way, the gap in the total conversion spectrum of the phosphor mixture between the emission spectrum of the first, green phosphor and the emission spectrum of the second, red phosphor can be closed particularly well.

In accordance with a further embodiment of the phosphor mixture, the second, red phosphor and also the third, orange-red phosphor are in each case a quantum dot phosphor, while the first, green phosphor is an activator-based phosphor.

By way of example, the third, orange-red phosphor, which is embodied as a quantum dot phosphor, includes one of the following materials or is formed from one of the following materials: CdSe, CdS, CdTe, InP, InAs, Cl(Z)S, AlS, $Zn_3N_2$, Si, ZnSe, ZnO, GaN.

Furthermore, it is also possible for the second, red phosphor to be a quantum dot phosphor, while the first, green phosphor and the third, orange-red phosphor are in each case an activator-based phosphor.

The third, orange-red, activator-based phosphor can contain a material or consist of a material which includes $Al(Al_aM_{1-a})SX_2AX_2NX_6{:}D$, wherein Al is at least one divalent metallic element, M is a different divalent metallic element than Al, D is one, two or more elements from the group Mn, Ce, Pr, Nd, Sm, Eu, Tb, Dy, Ho, Er, Tm, alkali metals, and Yb, SX contains at least one tetravalent element or is at least one tetravalent element, AX contains at least one trivalent element or is at least one trivalent element, NX contains at least one element selected from the group N, O, F, Cl or is one of these elements, the parameter a is between 0.6 and 1.0 inclusive, such as between 0.8 and 1.0 inclusive.

Furthermore, the third, orange-red, activator-based phosphor may include $Sr_xCa_{1-x}AlSiN_3{:}Eu$ or consist of this material, wherein between 0.1% and 5% inclusive of the Sr—Ca lattice sites and/or of the Sr/Ca lattice sites are substituted by Eu.

In addition, the third, orange-red, activator-based phosphor may include $(M''')_{2-2x'''}$-$Eu_{2x'''}$—$Si_5N_8$ or consist of this material, where $M'''$=Sr, Ca and/or Ba and $0.001 \leq x''' \leq 0.2$, such as $0.01 \leq x \leq 0.1$.

In accordance with a further embodiment, the phosphor mixture includes a fourth phosphor, the emission spectrum of which has an FWHM width of between 1 nanometer and 60 nanometers inclusive. The fourth phosphor emits electromagnetic radiation from the cyan-colored spectral range.

In a non-limiting embodiment, the fourth, cyan-colored phosphor has an emission spectrum having a peak wavelength of between 470 nanometers and 520 nanometers inclusive.

In a non-limiting embodiment, the fourth, cyan-colored phosphor is a quantum dot phosphor.

By way of example, the fourth, cyan-colored phosphor which is a quantum dot phosphor includes one of the following materials or is formed from one of the following materials: CdSe, CdS, CdTe, InP, $Zn_3N_2$, ZnSe, ZnO, GaN.

The fourth, cyan-colored phosphor can furthermore be an activator-based phosphor. By way of example, a material that conforms to one of the following formulae is suitable as fourth, cyan-colored activator-based phosphor: $AE_{2-x}L_x$-$SiO_{4-x}N_x$:RE and/or $AE_{2-x}L_xSi_{1-y}O_{4-x-2y}N_x$:RE and/or $AE_2SiO_4$:RE, wherein AE contains one or more elements selected from Mg, Ca, Sr, Ba or consists of one or more of these elements, and RE contains one or more elements selected from rare earth metals, such as contains at least Eu or consists of Eu, and L contains one or more elements selected from rare earth metals different than RE or consists of such an element, where $0<x \leq 0.1$, such as $0.003 \leq x \leq 0.02$ and $0<y \leq 0.1$, e.g. $0.002 \leq y \leq 0.02$.

With the aid of the fourth, cyan-colored phosphor, the total conversion spectrum of the phosphor mixture can be extended into the short-wave, visible spectral range, thus advantageously closing a gap between the total conversion spectrum and the excitation spectrum of a semiconductor chip which can generate the electromagnetic radiation with the excitation spectrum in an optoelectronic component. This considerably improves the color rendering of the total emission spectrum. In addition, the efficiency can generally be improved since on the long-wave side of the total spectrum less red light is required to obtain the desired color locus. This is advantageous in particular if not all the electromagnetic radiation of the excitation spectrum is converted into electromagnetic radiation having other emission spectra by the phosphor mixture, rather part of the electromagnetic radiation of the excitation spectrum leaves the component without being converted and contributes to a total spectrum of the component.

One non-limiting phosphor mixture includes a first phosphor, which has an emission spectrum having an FWHM width of between 70 nanometers and 150 nanometers inclusive and emits electromagnetic radiation from the green spectral range. In addition, the phosphor mixture in this embodiment includes a second phosphor, which has an emission spectrum having an FWHM width of between 1 nanometer and 40 nanometers inclusive and emits electromagnetic radiation from the red spectral range, and a fourth phosphor, which has an emission spectrum having an FWHM width of between 1 nanometer and 60 nanometers inclusive and emits electromagnetic radiation from the cyan-colored spectral range.

In accordance with a further embodiment, the first, green phosphor has an emission spectrum having a peak wavelength of between 500 nanometers and 560 nanometers inclusive. By way of example, the first, green phosphor has an emission spectrum having a peak wavelength of between 500 nanometers and 530 nanometers inclusive. The use of a short-wave green phosphor having a peak wavelength of between 500 nanometers and 530 nanometers inclusive has the advantage, like the cyan-colored, fourth phosphor as well, of extending the total conversion spectrum of the phosphor mixture into the short-wave spectral range and thus closing a gap between the blue excitation spectrum and the short-wave part of the total conversion spectrum of the phosphor mixture.

The first, green phosphor can for example contain a beta-SiAlON or consist of a beta-SiAlON. The beta-SiAlON can conform for example to the following chemical formula: $Si_{6-z}Al_zO_zN_{8-z}$:RE, wherein it holds true that: $0<z \leq 6$, and $0.001 \leq y \leq 0.2$, and RE is one or more elements selected from rare earth metals, such as at least Eu and/or Yb.

Furthermore, it is also possible for the first, green phosphor to include $Y_3(Al_{1-x}Ga_x)_5O_{12}$:Ce or to consist of this material, wherein the proportion of Ga is $0.2 \leq x \leq 0.6$, such as $0.3 \leq x \leq 0.5$, e.g. $0.35 \leq x \leq 0.45$.

In addition, the first, green phosphor may include $(Gd, Y)_3(Al_{1-x}Ga_x)_5O_{12}$:Ce or $(Tb, Y)_3(Al_{1-x}Ga_x)_5O_{12}$:Ce or consist of one of these materials, with a cerium proportion of 1.5 mol % to 5 mol %, such as 2.5 mol % to 5 mol %, and a gallium proportion x of 0 to 0.5, e.g. x of 0 to 0.1.

Furthermore, it is also possible for the first, green phosphor to include $Lu_3(Al_{1-x}Ga_x)_5O_{12}$:Ce or $(Lu, Y)_3(Al_{1-x}Ga_x)_5O_{12}$:Ce or to consist of one of these materials, with a cerium proportion of 0.5 mol % to 5 mol %, such as 0.5 mol % to 2 mol %, in each case relative to the rare earth metals, and a gallium proportion x of between 0 and 0.5, such as between 0.15 and 0.3.

In particular, the phosphor mixture described in the present case is suitable for being part of a conversion element. By way of example, the conversion element includes a resin, such as a silicone, into which the phosphors are introduced.

In one non-limiting embodiment of the conversion element, the cadmium content of the conversion element is not greater than 0.01% by weight. Such a low cadmium content accords, in particular, with the RoHS directive currently in force.

Furthermore, the phosphor mixture and the conversion element including the phosphor mixture are suitable for application in an optoelectronic component.

In accordance with one embodiment, the optoelectronic component includes a radiation-emitting semiconductor chip, which emits electromagnetic radiation having an excitation spectrum. In particular, the electromagnetic radiation having an excitation spectrum is suitable for exciting a phosphor, such as all phosphors, of the phosphor mixture.

The excitation spectrum of the semiconductor chip has a peak wavelength of between 435 nanometers and 460 nanometers inclusive.

The FWHM width of the excitation spectrum of the semiconductor chip has a value of between 10 nanometers and 30 nanometers inclusive.

The optoelectronic component particularly emits mixed-colored light having a total spectrum composed of electromagnetic radiation of the excitation spectrum and the electromagnetic radiation of the phosphor mixture having the total conversion spectrum. In a non-limiting embodiment, the optoelectronic component emits mixed-colored light having a color locus in the white, such as in the warm-white, range, for example in line with the color standard ANSI C78-377. In a non-limiting embodiment, the mixed-colored light attains a color rendering index Rf>80, such as Rf>90, according to the color standard IES TM-30-15 or the color standard CIE TC 1-90(2016). This is possible in particular by the use of quantum dot phosphors.

BRIEF DESCRIPTION OF THE DRAWINGS

Elements, embodiments and features disclosed in connection with the phosphor mixture in the present case can likewise be embodied in the case of the conversion element and in the case of the optoelectronic component, and respectively vice versa.

Further advantageous embodiments and developments will become apparent from the embodiments described below in association with the figures.

Elements that are identical, of identical type or act identically are provided with the same reference signs in the figures. The figures and the size relationships of the elements illustrated in the figures among one another should not be regarded as to scale; rather, individual elements, in particular layer thicknesses, may be illustrated with an exaggerated size in order to enable better illustration and/or in order to afford a better understanding.

DETAILED DESCRIPTION

Figure 1:
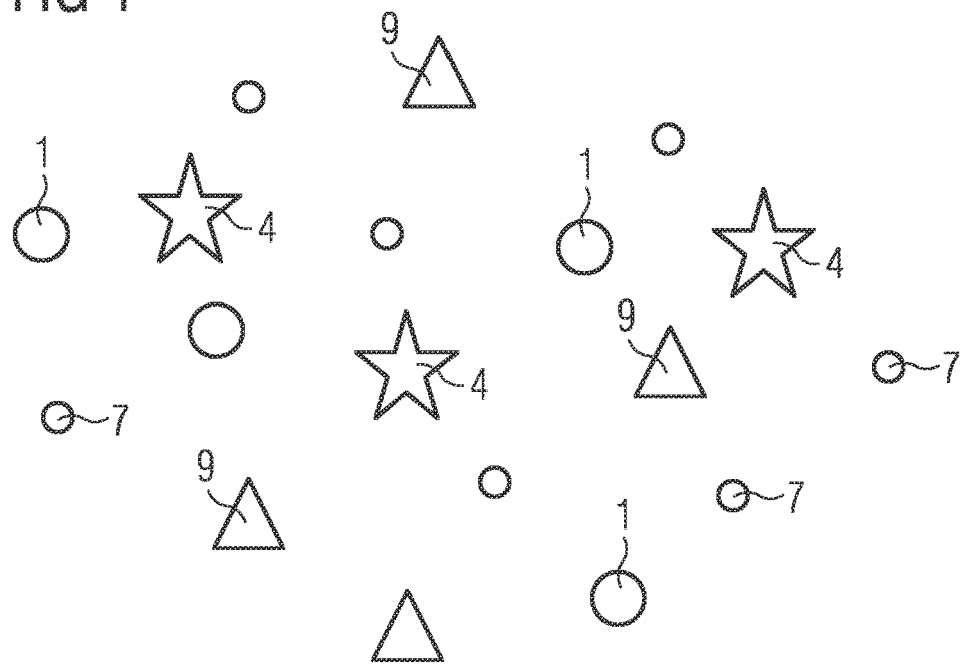
FIG. 1 shows a schematic illustration of a phosphor mixture in accordance with one embodiment.

The phosphor mixture in accordance with the embodiment in FIG. 1 includes a first phosphor 1, which has an emission spectrum 2 having an FWHM width 3 of between 70 nanometers and 150 nanometers inclusive and emits electromagnetic radiation from the green spectral range. Furthermore, the phosphor mixture includes a second phosphor 4, which emits electromagnetic radiation from the red spectral range and which has an emission spectrum 5 having an FWHM width 6 of between 1 nanometer and 40 nanometers inclusive. Furthermore, the phosphor mixture in accordance with FIG. 1 includes a third phosphor 7, which emits electromagnetic radiation from the orange-red spectral range and the emission spectrum 13 of which has an FWHM width 8 of between 70 nanometers and 90 nanometers inclusive.

In addition, the phosphor mixture in accordance with the embodiment in FIG. 1 furthermore also includes a fourth, cyan-colored phosphor 9, which emits electromagnetic radiation from the cyan-colored spectral range. In the present case, an emission spectrum 10 of the fourth, cyan-colored phosphor 9 has an FWHM width 11 of between 1 nanometer and 60 nanometers inclusive.

Figure 2:
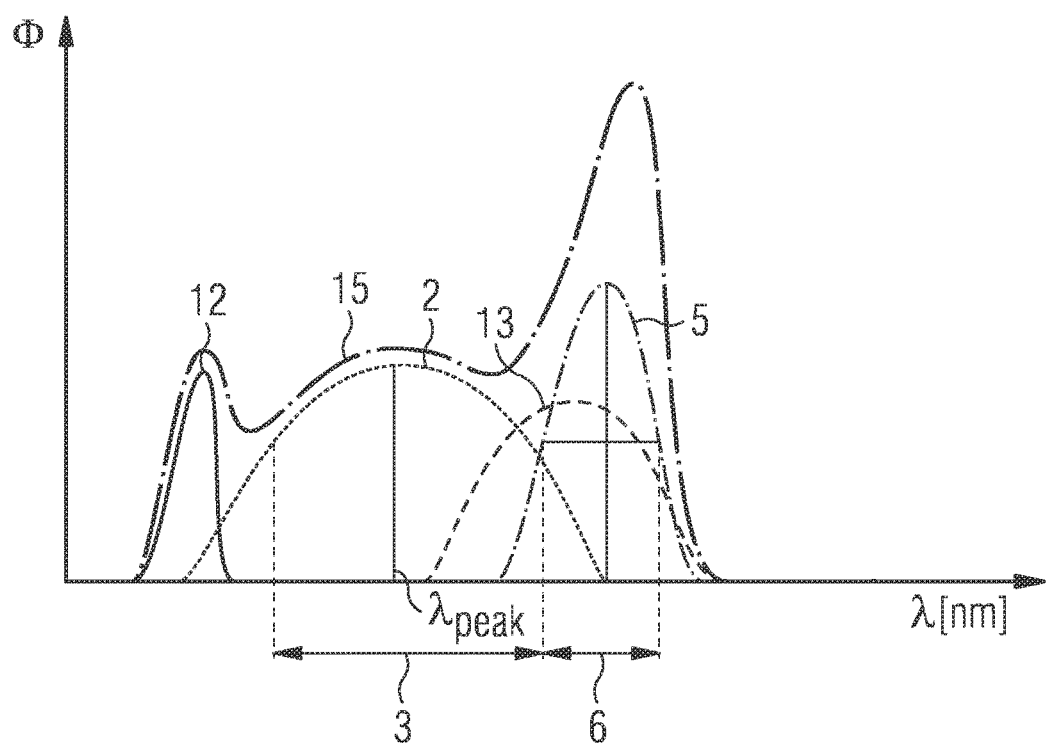
FIGS. 2 to 5 show total conversion spectra of phosphor mixtures together with an excitation spectrum in accordance with a respective embodiment.

FIG. 2 schematically shows a total conversion spectrum of a phosphor mixture together with an excitation spectrum 12 and the resultant total spectrum of an optoelectronic component. In this case, the spectral intensity I or the spectral luminous flux $\phi$ of the emitted radiation is represented as a function of the wavelength $\lambda$.

The total conversion spectrum of the phosphor mixture in accordance with the embodiment in FIG. 2 has an emission spectrum 2 of the first, green phosphor 1 having an FWHM width 3 of between 70 nanometers and 150 nanometers inclusive. The emission spectrum 2 of the first, green phosphor 1 is embodied as comparatively broad. Furthermore, the total conversion spectrum in accordance with FIG. 2 has an emission spectrum 5 of a second, red phosphor 4. In a non-limiting embodiment, in the present embodiment, an activator-based phosphor is used for the first, green phosphor 1 and a quantum dot phosphor is used for the second, red phosphor 4.

Furthermore, the phosphor mixture having the total conversion spectrum in FIG. 2 includes a third, orange-red phosphor 7, the emission spectrum 13 of which has a comparatively large FWHM width 8. In the present embodiment, the third, orange-red phosphor 7 is embodied as activator-based. The third, orange-red phosphor 7 closes a gap in the total conversion spectrum between the emission spectrum 2 of the first, green phosphor 1 and the emission spectrum 5 of the second, red phosphor 4. In this way, the total conversion spectrum of the phosphor mixture can advantageously be made more continuous, with the result that the color rendering is increased. In addition, it is possible to reduce the quantity of red quantum dot phosphor since part of the red light emitted by the phosphor mixture is generated by the activator-based third, orange-red phosphor 7. This makes it possible advantageously to reduce the cadmium proportion of the phosphor mixture.

Furthermore, FIG. 2 shows an emission spectrum 12 generated by a blue light-emitting diode chip 14, for example.

The total spectrum 15 of an optoelectronic component including the excitation spectrum 14 and the total conversion spectrum of the phosphor mixture is illustrated in a dashed manner in FIG. 2.

Figure 3:
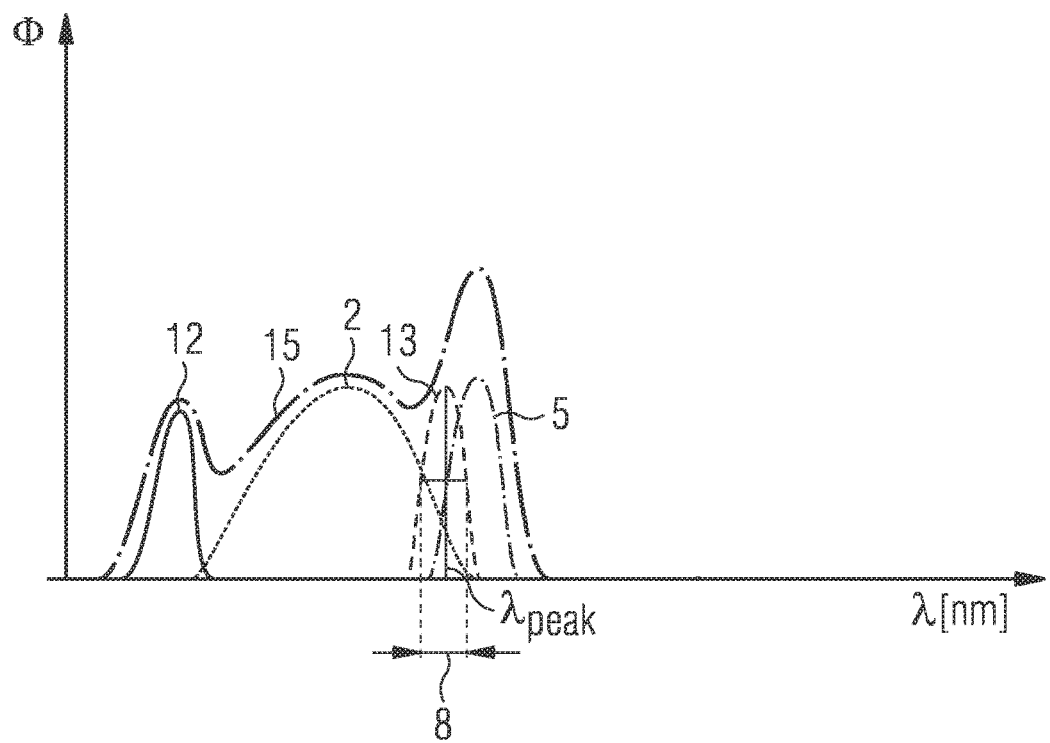

In the case of the phosphor mixture in accordance with the embodiment in FIG. 3, besides the first, green phosphor 1 and the second, red quantum dot-based phosphor 4, such as have already been described with reference to FIG. 2, said phosphor mixture furthermore includes a third, in the present case likewise quantum dot-based, phosphor 7. The third phosphor 7 emits electromagnetic radiation from the orange-red spectral range. The third, orange-red quantum dot-based phosphor 7 likewise closes the gap between the emission spectrum 2 of the first, green activator-based phosphor 1 and the emission spectrum 5 of the second, red quantum dot-based phosphor 4.

Figure 4:
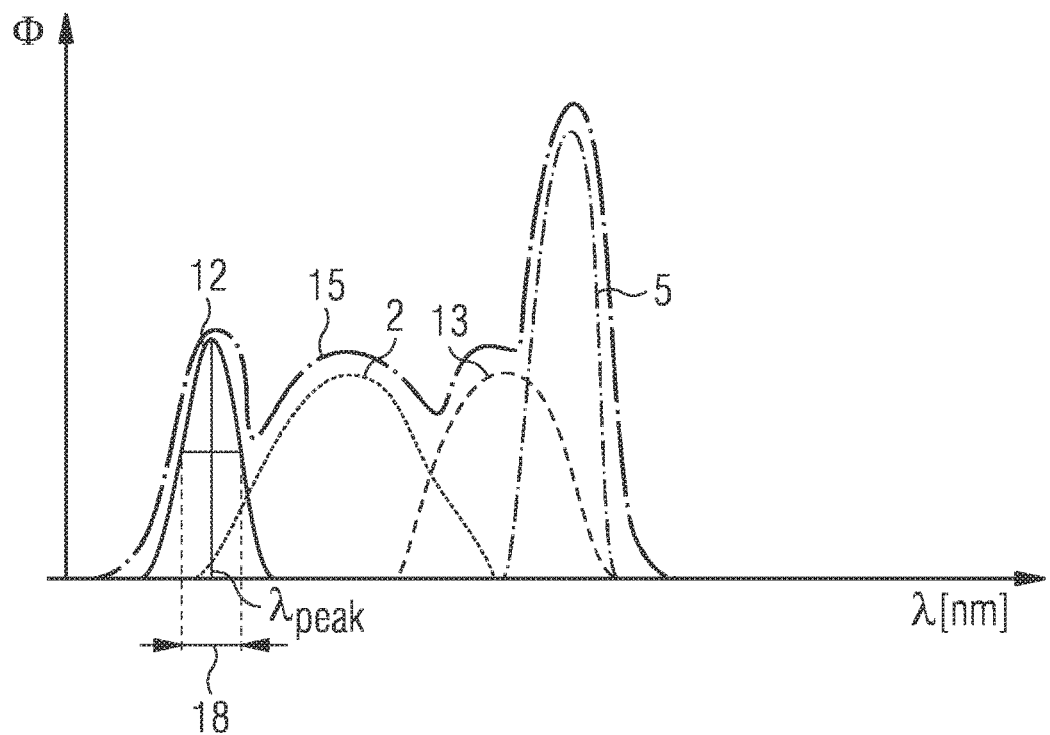

In contrast to the phosphor mixture having the total conversion spectrum in accordance with the embodiment in FIG. 2, the phosphor mixture having the total conversion spectrum in accordance with the embodiment in FIG. 4 includes a first, green phosphor 1, the peak wavelength $\lambda_{peak}$ of which is shifted to shorter wavelengths. In this embodiment, the peak wavelength $\lambda_{peak}$ of the first, green phosphor 1 is between 500 nanometers and 530 nanometers inclusive. Furthermore, the FWHM width 18 of the excitation spectrum 12 is depicted in FIG. 4.

Figure 5:
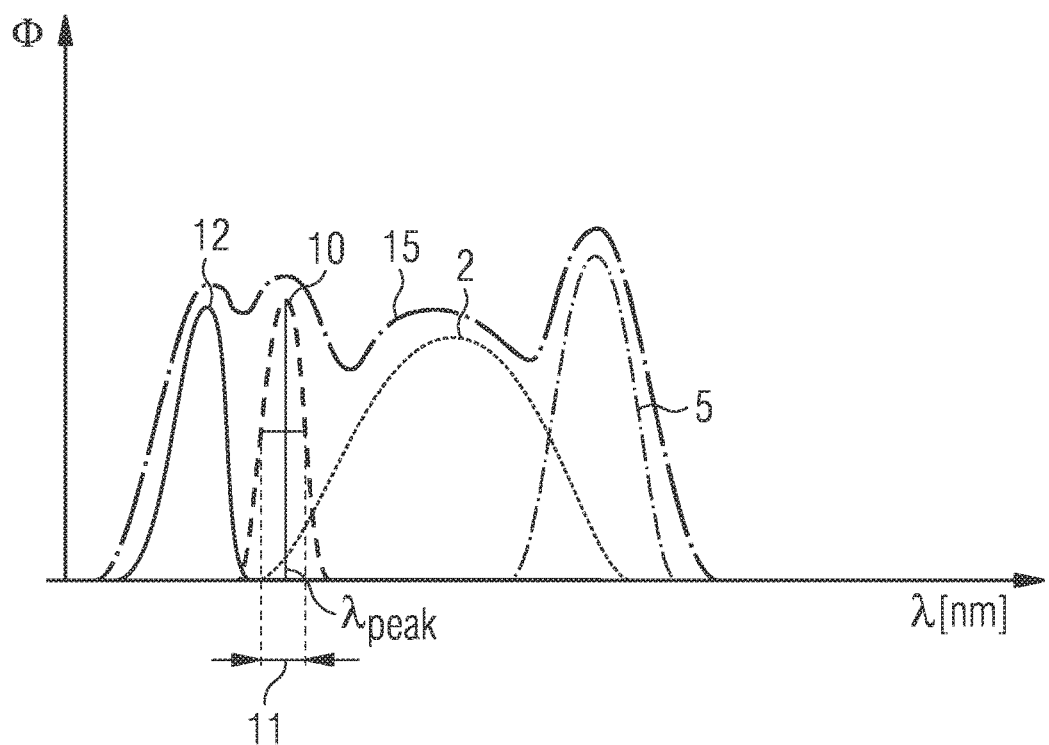

The phosphor mixture having the total conversion spectrum in accordance with the embodiment in FIG. 5 includes, besides the first, green phosphor 1 and the second, red phosphor 4, such as have already been described with reference to FIG. 2, furthermore a fourth, cyan-colored phosphor 9, which is quantum dot-based in the present case. The emission spectrum 10 of the fourth, cyan-colored quantum dot phosphor 9 here advantageously fills the gap between the total conversion spectrum of the phosphor mixture and the excitation spectrum 12. This advantageously likewise results in a particularly continuous total spectrum 15 with good color rendering. A fourth, cyan-colored quantum dot phosphor 9 of this type can likewise be present in the embodiments already described in accordance with FIGS. 2 to 4.

Figure 6:
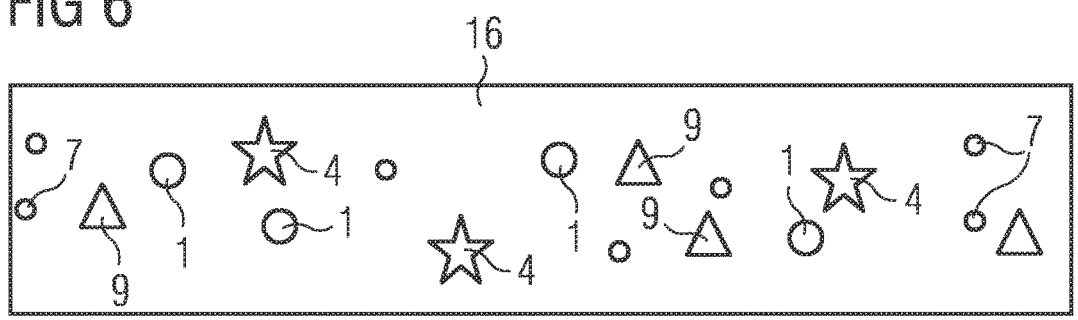
FIG. 6 shows a schematic sectional illustration through a conversion element in accordance with one embodiment.

The conversion element in accordance with the embodiment in FIG. 6 includes a phosphor mixture such as has already been described for example with reference to FIG. 1. In this case, the phosphor mixture may include activator-based phosphors in particle form and quantum dot-based phosphors. By way of example, the phosphor mixture is introduced into a silicone matrix 16. The conversion element can be embodied as a potting or else as a conversion lamella.

Figure 7:
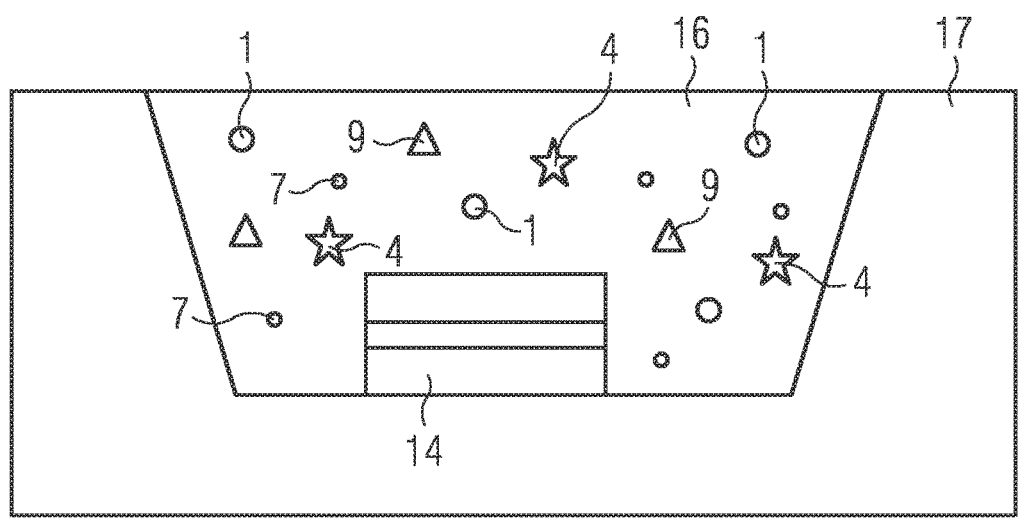
FIG. 7 shows a schematic sectional illustration of an optoelectronic component in accordance with one embodiment.

The optoelectronic component in accordance with the embodiment in FIG. 7 includes a radiation-emitting semiconductor chip, such as a light-emitting diode chip 14, which emits electromagnetic radiation of an excitation spectrum 12, wherein the excitation spectrum 12 has a peak wavelength $\lambda_{peak}$ of between 435 nanometers and 460 nanometers inclusive. Embodiments of the excitation spectrum 12 are illustrated schematically for instance in FIGS. 2 to 5. In the present case, the semiconductor chip 14 is introduced into the recess of a component housing 17. The recess of the component housing 17 is filled with a conversion element embodied as a potting. The phosphor mixture which can be contained in the conversion element has already been described for instance with reference to FIG. 1 or else in association with FIG. 6. The component emits warm-white electromagnetic radiation composed of converted radiation of the phosphor mixture and unconverted radiation of the semiconductor chip 14.

The present application claims the priority of the German application DE 102017122996.5, the disclosure content of which is hereby incorporated by reference.

The invention is not restricted to the embodiments by the description on the basis of said embodiments. Rather, the invention encompasses any novel feature and also any combination of features, which in particular includes any combination of features in the patent claims, even if this feature or this combination itself is not explicitly specified in the patent claims or embodiments.

LIST OF REFERENCE SIGNS

1 First phosphor
2 Emission spectrum of the first phosphor
3 FWHM width of the first phosphor
4 Second phosphor
5 Emission spectrum of the second phosphor
6 FWHM width of the second phosphor
7 Third phosphor
8 FWHM width of the third phosphor
9 Fourth phosphor
10 Emission spectrum of the fourth phosphor
11 FWHM width of the fourth phosphor
12 Excitation spectrum
φ Intensity
λ Wavelength
13 Emission spectrum of the third phosphor
14 Light-emitting diode chip
15 Total spectrum
$\lambda_{peak}$ Peak wavelength
16 Silicone matrix
17 Component housing
18 FWHM width of the excitation spectrum

The invention claimed is:

1. An optoelectronic component comprising:
a radiation-emitting semiconductor chip configured to emit electromagnetic radiation within an excitation spectrum; wherein the excitation spectrum has a peak wavelength ranging from 435 nm to 460 nm inclusive; and
a phosphor mixture comprising:
a first phosphor having an emission spectrum with an FWHM width ranging from 70 nanometers to 150 nanometers inclusive; and wherein the first phosphor is configured to emit electromagnetic radiation in the green spectral range;
a second phosphor having an emission spectrum with an FWHM width ranging from 1 nanometer to 40 nanometers inclusive; and wherein the second phosphor is configured to emit electromagnetic radiation in the red spectral range; and
a third phosphor having an emission spectrum with an FWHM width ranging from 25 nanometers to 100 nanometers inclusive; and wherein the third phosphor is configured to emit electromagnetic radiation in the orange-red spectral range; wherein the emission spectrum of the third phosphor has a peak wavelength which has a spectral separation with respect to the peak wavelength of the emission spectrum of the second phosphor ranging from 5 nm to 30 nm.

2. The optoelectronic component as claimed in claim 1, further comprising a fourth phosphor having an emission spectrum with an FWHM width ranging from 1 nanometer to 60 nanometers inclusive; and wherein the further phosphor is configured to emit electromagnetic radiation in the cyan-colored spectral range.

3. The optoelectronic component as claimed in claim 2, wherein the fourth phosphor has an emission spectrum having a peak wavelength ranging from 470 nanometers to 520 nanometers inclusive.

4. The optoelectronic component as claimed in claim 2, wherein the fourth phosphor is a quantum dot phosphor.

5. The optoelectronic component as claimed in claim 1, wherein the FWHM width of the emission spectrum of the third phosphor ranges from about 70 nanometers to about 90 nanometers inclusive.

6. The optoelectronic component as claimed in claim 1, wherein the FWHM width of the emission spectrum of the third phosphor ranges from about 25 nanometers to about 45 nanometers inclusive.

7. The optoelectronic component as claimed in claim 1, wherein the emission spectrum of the third phosphor has a peak wavelength having a spectral separation with respect to the peak wavelength of the emission spectrum of the second ranging from about 5 nanometers to about 30 nanometers inclusive.

8. The optoelectronic component as claimed in claim 1, wherein the emission spectrum of the third phosphor has a peak wavelength ranging from about 580 nanometers to about 620 nanometers inclusive.

9. The optoelectronic component as claimed in claim 1, wherein the first has an emission spectrum having a peak wavelength ranging from about 500 nanometers to about 560 nanometers inclusive.

10. The optoelectronic component as claimed in claim 1, wherein the first has an emission spectrum having a peak wavelength ranging from about 500 nanometers to about 530 nanometers inclusive.

11. The optoelectronic component as claimed in claim 1, wherein the emission spectrum of the second has a peak wavelength ranging from about 610 nanometers to about 635 nanometers inclusive.

12. The optoelectronic component as claimed in claim 1, wherein the third phosphor is a quantum dot phosphor; and wherein the first is an activator-based phosphor.

13. The optoelectronic component as claimed in claim 1, wherein each of the first phosphor and the third phosphor is an activator-based phosphor.

14. The optoelectronic component as claimed in claim 1, which emits mixed-colored, warm-white light.

15. The optoelectronic component as claimed in claim 1, wherein the third phosphor has an emission spectrum having a greater FWHM width as compared to the second phosphor.

16. The optoelectronic component as claimed in claim 1, wherein the second phosphor comprises a cadmium-based material.

17. The optoelectronic component as claimed in claim 16, wherein the cadmium-based material is selected from the group consisting of CdSe, CdS, CdTe, and combinations thereof.

18. The optoelectronic component as claimed in claim 1, wherein the second phosphor is a quantum dot phosphor comprising a material selected from the group consisting of a cadmium-based material, InP, InAs, Cl(Z)S, AlS, $Za_3N_2$, Si, ZnSe, ZnO, GaN, and combinations thereof.

* * * * *